Figure 1:
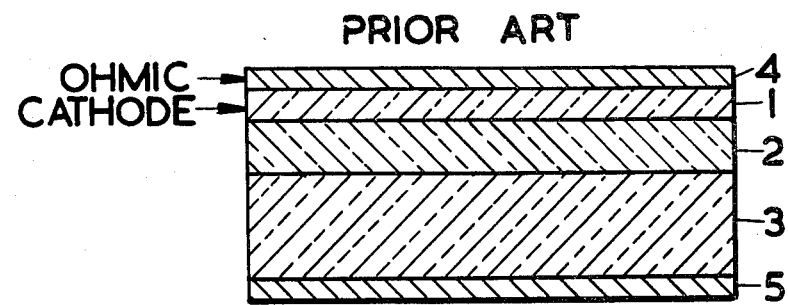

United States Patent [19]

Gray et al.

[11] 4,417,261

[45] Nov. 22, 1983

[54] TRANSFERRED ELECTRON DEVICES

[75] Inventors: Kenneth W. Gray; James E. Pattison; Huw D. Rees, all of Malvern, England

[73] Assignee: The Secretary of State for Defence in Her Britannic Majesty's Government of the United Kingdom of Great Britain and Northern Ireland, London, England

[21] Appl. No.: 830,950

[22] Filed: Sep. 6, 1977

Related U.S. Application Data

[63] Continuation-in-part of Ser. No. 685,575, May 12, 1976, abandoned.

[30] Foreign Application Priority Data

May 13, 1975 [GB] United Kingdom ............... 20218/75

[51] Int. Cl.³ ...................... H01L 47/02; H01L 47/00
[52] U.S. Cl. .......................................... 357/3; 357/6; 357/58
[58] Field of Search .................................. 357/3, 6, 58

[56] References Cited

U.S. PATENT DOCUMENTS

| 3,600,705 | 8/1971 | Tantraporn et al. | 357/3 |
| 3,614,549 | 10/1971 | Lorenz et al. | 357/61 |
| 3,836,990 | 9/1974 | Harth | 357/6 |
| 3,977,015 | 8/1976 | Irving et al. | 357/3 |
| 4,006,490 | 2/1977 | Moutou et al. | 357/3 |

OTHER PUBLICATIONS

Gray et al., "InP Microwave Oscillators with 2-Zone Cathodes", Electronics Letters, Aug. 21, 1975, vol. 11, No. 17, pp. 402–403.
Aspnes et al., "Ordering . . . of $L_6^c$ and $X_6^c$ . . . minima in GaAs", Phys. Rev. Lett. 37, 766–769 (Sep. 20, 1976).

Primary Examiner—William D. Larkins
Attorney, Agent, or Firm—Pollock, Vande Sande & Priddy

[57] ABSTRACT

A transferred electron device includes a novel cathode giving improvement in the dc to microwave conversion efficiency over a wide temperature range. The cathode comprises a narrow n+ semiconductor zone next to the device active region or layer and, next to the n+ zone, a high field contact which includes a region of semiconductor.

13 Claims, 6 Drawing Figures

TRANSFERRED ELECTRON DEVICES

CROSS REFERENCE TO RELATED APPLICATION

The present application is a continuation-in-part of U.S. application Ser. No. 685,575 filed May 12, 1976, for Transferred Electron Devices, now abandoned.

The present invention relates to transferred electron devices.

Transferred electron devices such as Gunn diodes are semiconductor devices which in recent years have been used in a variety of applications as microwave generators. They comprise a piece or region of n-type semiconductor material having an appropriate energy band structure, which material is hereinafter referred to as the 'active material', and two electrodes, the anode and the cathode, attached to the active material for the purpose of applying a high electric field across the active material with the cathode biased negatively. Transferred electron devices operate by the transferred electron effect by which the state of some free electrons in the active material is transferred from a conduction band region of low energy and high mobility to one or more conduction band regions of high energy and low mobility by the application of a high electric field equal to or greater than a threshold level. Electrical current oscillations in the active material result, and these can be converted into electro-magnetic microwaves in a conventional microwave cavity. Examples of transferred electron devices are described in United Kingdoms Patent Specification Nos. 1,205,211 and 1,286,674 and 1,354,511. In the last mentioned specification some advantages of making transferred electron devices from a semiconductor material containing indium phosphide as a major constituent is also discussed.

The efficiency of conversion of dc to microwave power by a transferred electron device is a very important parameter, and it is frequently desirable for this efficiency to be as high as possible. For example, if the device is to be used as a radar transmitter source driven from a power source of limited power then if the device efficiency is maximized the transmitted signal strength will be maximized as a result. Unfortunately the efficiencies of devices obtained in practice fall short of their theoretically possible limits particularly for high operation frequencies (of the order of 10 GHz or more).

U.S. Pat. No. 3,600,705 Tantraporn described a device having a sub-critically doped active layer. The device is used as an amplifier, or with external circuits, an oscillator. In order to improve the d.c. field uniformity in the active layer and to keep this field above a threshold value an electron blocking or injection limiting cathode structure is used.

In practice the efficiency of devices using electron blocking contacts on GaAs devices have not been as high as predicted. For example peak efficiencies below 7% have been reported in I.E.E.E. Trans. on Electron Devices, Vol. ED 18, No. 2, February, 1971, article by Se Puan Yu, W Tantraporn, J. D. Young at pages 88 to 93. Devices using super critically doped active layers and electron blocking contacts have been found to have typical efficiencies of less than 10%, this is reported in Electronics Letters, Aug. 21st 1975, Vol. 11, No. 17.

U.S. Pat. No. 3,836,990, Harth discloses a component for use as an oscillator and having the layer sequence metal (cathode), insulator, semiconductor, metal (anode). The insulator is made thin, e.g. 30 to 50 Å thick so that it can be tunnelled by electrons. The field in the insulator required to effect a sufficient tunnelling current is high, well above that required in the active layer, and therefore to prevent ionization by impact a thin $n^+$ layer of semiconductor is arranged between the insulator and active layer. Partial or complete depletion of the $n^+$ layer occurs and this causes the electric field to fall. Use of a thin $n^{30}$ layer to reduce the field is well known in transistor contact technology.

U.S. Pat. No. 4,006,490, Moutou et al described a Gunn diode having the layer structure metal, amorphous layer, $n^+$ layer, active layer, anode. Again, as in Harth, the device operates by the tunnelling effect of electrons through the thin amorphous germanium layer. A high field is required to obtain this tunnelling and therefore an $n^+$ layer is incorporated to lower the field at the junction with the active layer.

An object of the present invention is to increase the efficiency of transferred electron devices to values close to the theoretical limits.

It is conventional to label the doping density of the active region of a transferred electron device as being sub-critical or super-critical. When the average electric field in the active region exceeds the threshold level, the electric field tends to become non-uniform and this tendency increases as the doping level is increased. If the doping level is high enough and the cathode contact is suitable, it becomes possible for a domain of locally high electric field to be generated at the cathode contact and propagate to the anode contact. This is the super-critical case. In the sub-critical case the doping level is too low to allow this to occur because the region of high electric field is wider, extending through the whole device. The transition from sub-critical to super-critical behaviour occurs for a value of the product of the doping level and length of the active region, termed the nL product, of approximately $10^{12}$ cm$^{-2}$ for the semiconductors GaAs and InP. However this value is not a precise figure because the form of the high field domain depends on the nature of the cathode contact. The present invention includes a super-critically doped active layer, the typical nL product for a GaAs or an InP device being in the range $5 \times 10^{11}$ cm$^{-2}$ to $5 \times 10^{12}$ cm$^{-2}$, and a cathode contact which effects a switching of the active region between a state where the field is around or just below the threshold value through most of the active region to a state where the field is much greater than the threshold value, typically more than 4 times the threshold value, throughout most of the active region. In between these states the electric field is not, however, uniform in the active region. Because of the high electron density compared with a sub-critically doped device, losses associated with electron bunching in the active region are comparatively low and the device can convert d.c. to microwave power efficiently in a large signal oscillation mode. The device may be used as the active element of an oscillator or it may be locked with an external source and used as a large signal amplifier.

According to the present invention a transferred electron oscillator device includes a region of active material, a cathode attached to the active material and an anode attached to the active material, characterized in that the cathode comprises next to the active material a first zone of $n^+$ semiconductor material having a donor concentration greater than that of the active material, and a second zone providing a high resistance electrical contact to the first zone, the second zone comprising a region of semiconductor next to the first zone and an outer metal region.

The active material may be any n-type semiconductor material exhibiting the transferred electron effect, for instance indium phosphide, gallium arsenide or indium arsenide phosphide, and may be in the form of an epitaxial layer.

The first zone of the cathode is preferably an n+ semiconductor layer having a thickness not greater than 2 $\mu$m, typically 0.03 $\mu$m, and a donor concentration of about $10^{16}$ to $10^{17}$ cm$^{-3}$. The product of the donor concentration and thickness is preferably greater than $3 \times 10^{10}$ cm$^{-2}$.

The second zone of the cathode may provide a high resistance electrical contact to the first zone by containing one or more regions of high resistivity material, by forming an electrical barrier with the first zone, or by containing one or more electrical barriers within itself, or by a combination of these mechanisms. Various ways in which the second zone may be made are described below.

It has been found that the invention unexpectedly provides an improvement in the d.c. to microwave conversion efficiency of a transferred electron device. The apparent reasons why the efficiency is improved are described below.

Figure 2:
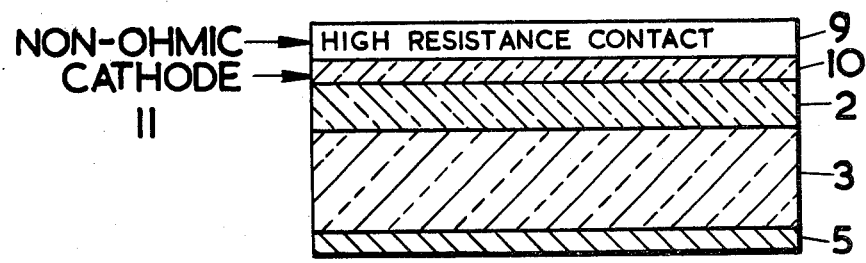

Embodiments of the invention will now be described by way of example with reference to the accompanying drawings, in which:

FIGS. 1 and 2 are cross-sectional views (not to scale) of transferred electron devices, FIG. 1 showing a prior art device and FIG. 2 showing a device embodying the invention; and FIGS. 3 to 6 are graphs (not to scale) illustrating operation of the devices shown in FIGS. 1 and 2.

In the prior art device shown in FIG. 1 an n-type active layer 2 is epitaxially deposited on an n+ anode substrate 3. An n$^{30}$ cathode layer 1 having a thickness of several microns is epitaxially deposited on the active layer 2. The layers 1 and 2 and the substrate 3 have approximate donor concentrations of $10^{17}$, $10^{15}$ and $10^{17}$ cm$^{-3}$ respectively. Ohmic metal contacts 4, 5 are deposited on the n+ layer 1 and the anode substrate 3 respectively.

If an electric field equal to or greater than a threshold value is applied between the ohmic contacts 4, 5 and across the active layer 2 current oscillations build up in the active layer 2 by the transferred electron effect described above.

In the device embodying the invention shown in FIG. 2 the n-type active layer 2, the n+ anode substrate 3 and the ohmic contact 5 are all basically the same as in the prior art device. The active layer 2 has a thickness less than 15 microns (typically 2 to 10 microns) and a donor concentration of about $10^{15}$ cm$^{-3}$ and may be formed for example of InP, $InP_xAs_{1-x}$, $1 > X > 0.75$, GaAs or a ternary alloy of InP, e.g. $InAl_yP$ where y is small enough so that the transferred electron effect is observed at room temperatures. The active layer is supercritically doped i.e. its $n_o$ L product being typically between $5 \times 10^{11}$ cm$^{-2}$ and $5 \times 10^{12}$ cm$^{-2}$, $n_o$ being equilibrium charge carrier concentration and L being thickness of active layer. The anode substrate 3, which has a donor concentration of about $10^{17}$ cm$^{-3}$, may be formed of the same semiconductor material as the active layer 2. The cathode, labelled 11, of the device shown in FIG. 2 is different from the cathode of FIG. 1 however. A layer 10 of n+ semiconductor material, preferably the same material as that of the active layer 2, is epitaxially deposited on the layer 2. The n+ layer 10 has a thickness less than 2 $\mu$m (typically 200 Å) and a donor concentration of $10^{16}$ to $10^{17}$ cm$^{-3}$. A high resistance contact 9 to the n+ layer 10 is formed on the layer 10 in one of the following ways:

(a) An n-type semiconductor layer, preferably epitaxial, having a thickness less than 4.0 $\mu$m (typically 1 $\mu$m) and a donor concentration much less than the active layer 2 (typically $10^{14}$ cm$^{-3}$) is formed on the layer 10 and a low resistance contact is formed on the n-type layer for instance by evaporating and subsequently heating a metal such as silver with a donor impurity metal such as tin or by epitaxially growing an n+ layer on the n layer with a metal forming a low resistance outer contact evaporated on the n+ layer.

(b) An n-type semiconductor layer having a thickness less than 4.0 $\mu$m (typically 0.5 $\mu$m) and of any donor concentration (but typically $10^{15}$ cm$^{-3}$) is formed on the n+ layer 10 and a metal layer is deposited on the n-type layer, the metal forming or being heat treated (after deposition) to form a Schottky-barrier or Schottky-barrier-like interface with the n-type layer. For example if the metal is titanium or chromium such an interface will be produced immediately upon deposition. If the metal is silver, gold or nickel further heat treatment is required to produce the interface. Silver is preferably heated to 420° C. and maintained at this temperature for about 1 minute in an inert atmosphere.

(c) a p-type semiconductor layer of any acceptor concentration, but typically $10^{15}$ cm$^{-3}$, and a thickness less than 4 $\mu$m, typically 0.5 $\mu$m is formed on the n+ layer 10, an outer n+ layer is formed on the p-type layer and a metal forming a low resistance outer contact is evaporated on the outer n+ layer.

(d) a p+ layer typically 0.5 $\mu$m thick is deposited on the n+ layer 10 and a metal forming a low resistance outer contact is deposited by evaporation on the p+ layer.

(e) A p- or n-type semiconductor layer (typically 0.5 $\mu$m thick) is deposited on the n+ layer 10 and a metal film, e.g. silver, is evaporated on the p- or n-type layer. The metal film is heat treated to cause a high resistance zone to be formed in part or all of the p- or n-type layer. This zone may be caused by diffusion from the metal film.

(f) A p- or n-type semiconductor layer of any doping concentration (but typically $10^{15}$ cm$^{-3}$) and having a thickness typically 0.5 $\mu$m is formed on the n+ layer 10 and is converted to a high resistance form throughout part or all of its thickness by bombardment with high energy ions, such as protons, in a known way. A metal film, such as silver or nickel, which may subsequently be heat treated, is evaporated on the p- or n-type layer.

(g) An n-type semiconductor layer having a thickness less than 4.0 $\mu$m (typically 0.5 $\mu$m) and of any donor concentration (but typically $10^{15}$ cm$^{-3}$) is formed on the n+ layer 10, a layer of insulator, such as $Al_2O_3$, approximately 100 Å thick, is deposited on the n-type layer and an outer metal layer is formed on the insulator layer.

In all cases (a) to (g) above the semiconductor layer between its cathode metal layer and the n+ layer is sufficiently thick to prevent appreciable tunnelling by electrons from the metal to the n+ layer 10, the current flow within the semiconductor layer next to the n+ layer being by normal conduction processes.

The device shown in FIG. 2 oscillates by the transferred electron effect but shows an improved efficiency compared with the FIG. 1 prior art device and prior art devices using electron blocking cathodes. The apparent reason for this improvement will now be described.

Figure 3:
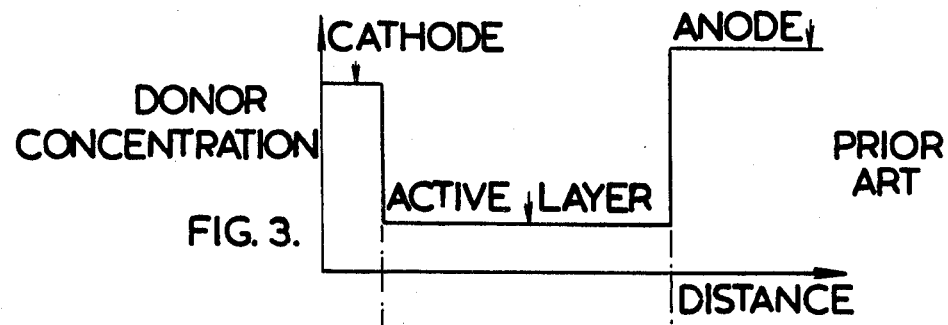
Figure 4:
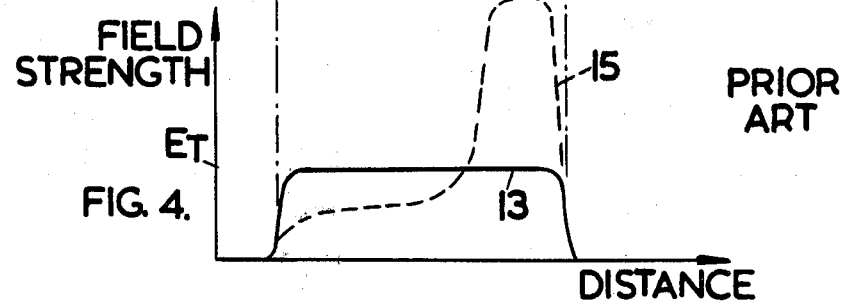

FIG. 3 is a graph of donor concentration plotted against distance perpendicular to the layers 1 and 2 through the FIG. 1 prior art device. As noted above the cathode n+ layer 1 and the anode n+ substrate 3 both have a high donor concentration (equivalent to a high conductivity) and the active layer 2 has a lower donor concentration. The contacts 4 and 5 are both highly conducting. FIG. 4 is a graph of electric field strength plotted against distance at two moments during the oscillation cycle of a device having the donor concentration profile shown in FIG. 3. The electric field strength appearing across the contacts 4, 5, the layer 1 and the substrate 3 are insignificant. Most of the applied field appears across the active layer 2.

The device undergoes transitions from a state of high current and low voltage to another state of higher voltage and lower current in the normal way by the transferred electron effect. In the low voltage, high current state illustrated by a curve 13 in FIG. 4 the electric field strength is close to the transferred electron effect threshold $E_T$ of the device throughout the active layer 2. However, in the higher voltage, lower current state illustrated by a curve 15 in FIG. 4 the field distribution is very non-uniform: near the cathode layer 1 the active layer 2 has a field much lower than $E_T$ whereas near the anode substrate 3 the active layer 2 has a field which is much greater than $E_T$. As a result the device voltage is much lower than would be obtained if the field were high throughout the active layer 2 and this reduction leads to a low efficiency.

The predominant cause of the non-uniform field distribution with portions of the device having fields near $E_T$ (curve 15) and hence the low efficiency is the ohmic nature of the cathode, comprising the layer 1 and coating 4, causing injection of electrons into the active layer 2 with a low kinetic energy (approximately equal to their thermal energy in the n+ cathode layer 1).

Attempts to overcome the non-uniform field in subcritically doped devices used electron blocking (non-ohmic) cathode contacts as described earlier (Tantraporn) to keep the electric field above the threshold value. However the theory behind such electron blocking contacts appears to consider the static or d.c. field situation only, and ignores the dynamic conditions existing in super critically doped devices. In practice it is necessary to consider the dynamic field conditions, because efficient oscillators operate under large signal conditions with excursions of the electric field from below threshold to values much greater than threshold. Theoretical aspects of this are disclosed in Proc. 5th Biennial Cornell Elec. Eng. Conf. 1975, pages 215–224.

Figure 5:
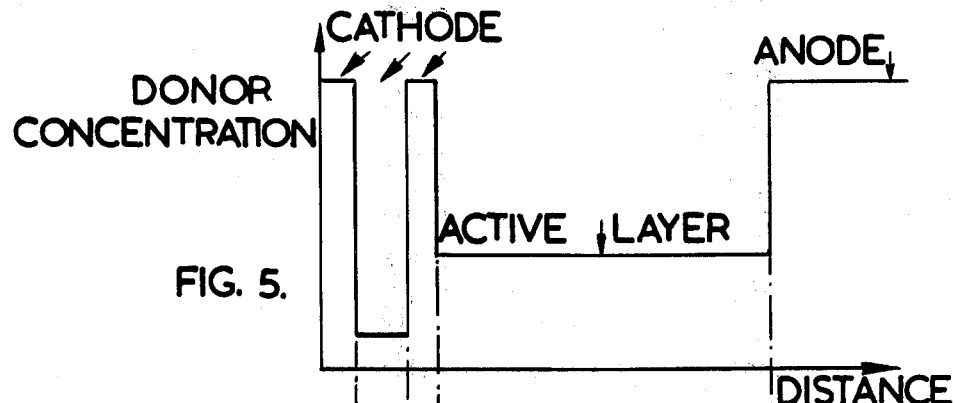
Figure 6:
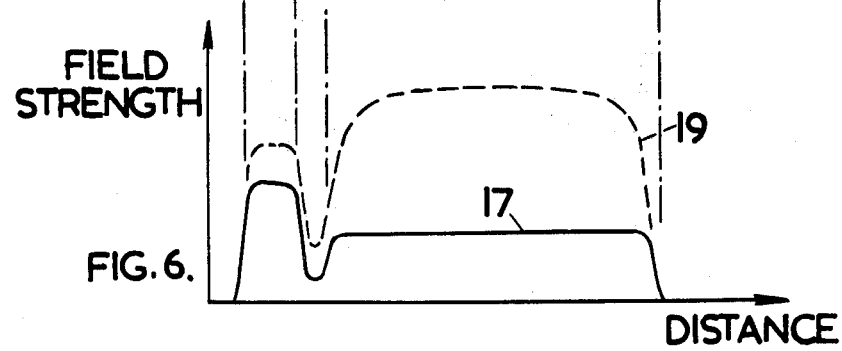

FIG. 5 is a graph of donor concentration plotted against distance perpendicular to the n+ layer 10 for one form of the device shown in FIG. 2, and FIG. 6 is a corresponding graph of electric field strength plotted against distance at two times during the oscillation cycle. The form of device whose performance is illustrated is the one described above in which the cathode comprises an n-type semiconductor layer having a low donor concentration on the n+ layer 10 and a low resistance contact to the n-type layer.

In FIG. 5 the donor concentration is high in the n+ layer 10 and in the n+ anode substrate 3, lower in the active layer 2 and lower still in the n-type layer formed on the layer 10. The low resistance contact to the n-type layer of the cathode 11 and the contact 5 both show a high conductivity.

In FIG. 6 field distributions at two moments during the oscillation cycle are shown: a curve 17 illustrates the low voltage, high current state of the device and a curve 19 illustrates the higher voltage, lower current state. In both cases a region of high field is produced in the high resistance contact 9 near to the n+ layer 10 and a rapid decrease in field occurs through the n+ layer 10. In contrast to the prior art device, a high field region extends through the active layer 2, most of the active layer 2 having fields much greater than $E_T$. In between the low and high voltage states, indicated by curves 17 and 19 respectively, the electric field in the device is not uniform. This non-uniformity is a consequence of the super-critical doping of the active layer. However the effect of the cathode in producing transitions between the two states indicated by curves 17 and 19 leads to improvement in the device efficiency.

Although the field distributions in the cathode 11 may vary from those shown in FIG. 6 according to the detailed construction of the cathode 11 in alternative forms of the FIG. 2 device nevertheless they show the common features of a high field region near the n+ layer 10 in the contact 9, a rapid decrease in field through the n+ layer 10 and a high field region extending through the active layer 2. The high resistance region causes the injection of 'hot' electrons into the active layer 2 with a high kinetic energy and the region of lower field in the n+ layer 10 is necessary for the establishment of the correct field distribution across the active layer 2. In contrast prior art devices using ohmic and non-ohmic cathodes inject cold electrons into the active layer.

The cathode 11 may additionally have a current limiting effect which causes the electric field strength in the high resistance contact 9 to oscillate with device current and this field oscillation may also be responsible for providing a high field region throughout the active layer 2.

It has been found experimentally that transferred electron devices embodying the invention which are made from indium phosphide active material and in which the high resistance contact 9 is provided by growing epitaxially a layer of low doped indium phosphide about 0.5 μm thick on top of the n+ layer 10 and then evaporating silver onto the surface and heatng the silver at 420° C. for 1 minute, have given efficiencies of about 15 to 20% at frequencies from 12 to 17 GHz. Prior art indium phosphide devices would typically have efficiencies of 5% at these frequencies. Furthermore, it has been found that these high efficiencies can be obtained over a wide range of temperatures. For example, the devices whose efficiencies are quoted above have given over 15% efficiency over the entire range from −50° C. to 150° C.

Table 1 shows typical efficiencies of two groups of devices having the following features:
Both groups
    Active material InP super critically doped
    Anode substrate n+ InP
    Anode contact silver evaporated onto the anode substrate
Group 1

Single zone cathode—silver evaporated onto active material (i.e. an electron blocking cathode constructed according to prior art)

Group 2

Two zone cathode (constructed according to the present invention)—first zone n+ layer InP on active material, second zone low doped InP on n+ layer and silver evaporated onto the low doped InP.

TABLE 1

| Specimen ref. | Active material doping density cm$^{-3}$ | Active material thickness | Applied voltage | Frequency GHz | Maximum Efficiency |
|---|---|---|---|---|---|
| Group 1 devices, microwave performance | | | | | |
| KV475 | $2.5 \times 10^{15}$ | 10.5μ | 40 | 15.4 | 7.5% |
| KV478 | $2 \times 10^{15}$ | 9.0μ | 40 | 15.4 | 9.9% |
| LV544 | $2 \times 10^{15}$ | 10.0μ | 38 | 13.0 | 8.9% |
| KV434 | $1 \times 10^{15}$ | 10.5μ | 40 | 12.0 | 10.0% |
| KV405 | $1.3 \times 10^{15}$ | 8.4μ | 40 | 12.8 | 9.4% |
| Group 2 devices, microwave performance | | | | | |
| LV31 | $1 \times 10^{15}$ | 6.3μ | 42 | 13.0 | 17.5% |
| LV362 | $2.5 \times 10^{15}$ | 6.5μ | 30 | 16.5 | 16.5% |
| CV484B | $2 \times 10^{15}$ | 8.0μ | 40 | 14.7 | 17.5% |
| LV636 | $1.5 \times 10^{15}$ | 6.0μ | 34 | 16.3 | 16.5% |
| CV573 | $3 \times 10^{15}$ | 10.0μ | 54 | 11.3 | 19.6% |

The results above show that by considering the dynamic field situations and using two zone cathodes the efficiency can be approximately doubled.

The variation of characteristics for similar Group 2 devices are described in Electronics Letters 21 August 1975, Vol. 1, No. 17, pages 402 to 403.

Another advantage of the cathode 11 is that it provides a current in the active layer 2 which is much smaller (typically by a factor of 3) than that provided by the cathode of the FIG. 1 prior art device. Consequently it is easier to cool the device embodying the invention shown in FIG. 2.

A further advantage is that the cathode 11 provides a greater resistance to damage if an unduly high bias voltage is applied.

Preferably when the device shown in FIG. 2 is in use the operating fields are not sufficient to cause a significant amount of electron-hole pair generation by avalanche bombardment, so that holes do not significantly contribute to the operation of the device.

Preferably the n+ layer in the device shown in FIG. 2 has a thickness less than 0.3 μm and a thickness x donor concentration product of $>3\times10^{10}$ cm$^{-2}$ to prevent the layer 10 acting as an ohmic contact. The thickness can however be in the range from 0.3 μm to 2 μm without the n+ layer 10 being an ohmic contact provided that the product of the thickness and the average donor concentration of the n+ layer 10 is less than about $3\times10^{12}$ cm$^{-2}$.

The n+ layer 10 need not have a uniform doping profile as indicated by FIG. 5. The profile may for instance be in the form of a triangular spike.

Semiconductor layers in the device shown in FIG. 2 may be grown by vapour phase epitaxy and the donor concentrations may be controlled in a known way by controlling the vapor phase concentrations during the growth or by adding controlled dopants during the growth.

Arrangements suitable for encapsulating the device shown in FIG. 2, for applying electric fields to the device and for extracting microwave oscillations from the device are described in U.K. Patent Specification No. 1,386,967.

What I claim is:

1. A transferred electron effect oscillator device comprising a cathode structure and an anode structure with a layer of n-type supercritically doped active material therebetween, said active material exhibiting the transferred electron effect by which electrons are scattered from states of high mobility to states of low mobility by the application of an electric field greater than a certain threshold level and thereby leading to a region of negative differential mobility in the functional dependence of mean electron velocity on electric field, wherein the cathode structure comprises a first zone next to the active layer, and a second zone providing a high electrical resistance to the first zone; said first zone comprising a layer of n+ semiconductor material of the same material as the active layer but having a doping concentration greater than that of the active material and a thickness less than 2 μm; said second zone comprising, next to the first zone, a layer of semiconductor material of the same material as the active layer but differently doped and of a thickness greater than 0.03 μm so that no appreciable amount of electrons can tunnel therethrough, and an outer metal layer.

2. A device according to claim 1 wherein the active material is InP.

3. A device according to claim 1 wherein the active material is InP$_x$As$_{1-x}$ where $1>x>0.75$.

4. A device according to claim 1 wherein the active material is GaAs.

5. A device according to claim 1 wherein the active material is In$_{1-y}$Al$_y$P where y is small enough so that the transferred electron effect is observed at room temperature.

6. A device according to claim 1 wherein the semiconductor layer in the second zone has a thickness between 0.1 and 1 μm inclusive.

7. A device according to claim 1 wherein the donor concentration in the n+ layer is greater than $10^{16}$ cm$^{-3}$.

8. A device according to claim 6 wherein the semiconductor layer in the second zone is n-type material having a donor concentration less than that of the active layer.

9. A device according to claim 8 wherein said semiconductor layer of said second zone also comprises an n+ layer between said n-type layer and the said outer metal layer.

10. A device according to claim 1 wherein the semiconductor layer of said second zone is a p-type layer having an average thickness less than 2 μm next to the first zone.

11. A device according to claim 10 wherein the semiconductor layer of the second zone also comprises an n+ layer between said p-type layer and said outer metal region.

12. A device according to claim 6 wherein the semiconductor layer of the second zone is an ion bombarded high resistivity region.

13. A transferred electron oscillator device having a region of active material exhibiting the transferred electron effect by which electrons are scattered from states of high mobility to states of low mobility by the application of an electric field greater than a certain threshold level and thereby leading to a region of negative differential mobility in the functional dependence of mean electron velocity on electric field, said device comprising in sequence:
an ohmic anode,
a layer of supercritically doped n-type indium phosphide active material,
an n+ layer of indium phosphide material of thickness less than 2 μm,
a layer of n-type indium phosphide material of thickness 0.1 to 1 μm inclusive, and a silver cathode contact.

* * * * *